(12) United States Patent
Wang et al.

(10) Patent No.: US 10,515,767 B2
(45) Date of Patent: Dec. 24, 2019

(54) MESOSCOPIC FRAMEWORK FOR ORGANIC-INORGANIC PEROVSKITE BASED PHOTOELECTRIC CONVERSION DEVICE AND METHOD FOR MANUFACTURING THE SAME

(71) Applicants: ECOLE POLYTECHNIQUE FEDERALE DE LAUSANNE (EPFL), Lausanne (CH); HUAZHONG UNIVERSITY OF SCIENCE AND TECHNOLOGY, Wuhan (CN)

(72) Inventors: Mingkui Wang, Wuhan (CN); Kun Cao, Yiyang (CN); Jin Cui, Huanggang (CN); Zhixiang Zuo, Ningbo (CN); Yan Shen, Wuhan (CN); Shaik Mohammad Zakeeruddin, Bussigny-Lausanne (CH); Michael Graetzel, St-Sulpice (CH)

(73) Assignees: ECOLE POLYTECHNIQUE FEDERALE DE LAUSANNE (EPFL), Lausanne (CH); HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 150 days.

(21) Appl. No.: 15/328,504

(22) PCT Filed: Jul. 24, 2015

(86) PCT No.: PCT/IB2015/055627
§ 371 (c)(1),
(2) Date: Jan. 24, 2017

(87) PCT Pub. No.: WO2016/012987
PCT Pub. Date: Jan. 28, 2016

(65) Prior Publication Data
US 2017/0213651 A1    Jul. 27, 2017

(30) Foreign Application Priority Data
Jul. 24, 2014 (CN) .......................... 2014 1 0357437

(51) Int. Cl.
*H01G 9/20* (2006.01)
*H01L 51/42* (2006.01)
(Continued)

(52) U.S. Cl.
CPC ......... *H01G 9/2018* (2013.01); *H01G 9/0036* (2013.01); *H01G 9/209* (2013.01);
(Continued)

(58) Field of Classification Search
None
See application file for complete search history.

(56) References Cited

U.S. PATENT DOCUMENTS

2015/0122314 A1* 5/2015 Snaith ................. H01L 51/4213
136/255

OTHER PUBLICATIONS

Tanaka et al., Comparative study on the excitons in lead-halide-based perovskite-type crystals CH3NH3PbBr3 CH3NH3PbI3, Solid State Communications 127, 2003, 619-623 (Year: 2003).*
(Continued)

*Primary Examiner* — Shannon M Gardner
(74) *Attorney, Agent, or Firm* — Matthias Scholl P.C.; Matthias Scholl

(57) ABSTRACT

The invention discloses a perovskite solar cell and a method of fabrication thereof. The perovskite solar cell sequentially comprises a transparent electrode, a mesoporous P-I-N framework and a counter electrode from the bottom to top; the mesoporous P-I-N framework is composed of an n-type semiconductor layer, an insulating layer, and a p-type semiconductor layer in a sequentially stacked mode, and the n-type semiconductor layer, the insulating layer and the p-type semiconductor layer all comprise mesopores filled
(Continued)

with a perovskite material. The preparation method sequentially includes preparing the mesoporous P-I-N framework on a transparent conductive substrate through a spin-coating method or a screen printing method, filling with the perovskite material and preparing the counter electrode layer.

13 Claims, 3 Drawing Sheets

(51) Int. Cl.
    *H01G 9/00*     (2006.01)
    *H01L 51/44*     (2006.01)
    *H01L 51/00*     (2006.01)

(52) U.S. Cl.
    CPC ......... *H01G 9/2022* (2013.01); *H01G 9/2027* (2013.01); *H01L 51/0032* (2013.01); *H01L 51/422* (2013.01); *H01L 51/4226* (2013.01); *H01L 51/4233* (2013.01); *H01L 51/4293* (2013.01); *H01L 51/442* (2013.01); *H01L 51/447* (2013.01); *H01L 2251/301* (2013.01); *H01L 2251/305* (2013.01); *H01L 2251/306* (2013.01); *H01L 2251/308* (2013.01); *Y02E 10/549* (2013.01); *Y02P 70/521* (2015.11)

(56) References Cited

OTHER PUBLICATIONS

The Importance of Perovskite Pore Filing in Organometal Mixed Halide Sensitized TiO2based solar cells, J. Phys Chem. Lett 2014, 5, 1096-1102 (Year: 2014).*

* cited by examiner

MESOSCOPIC FRAMEWORK FOR ORGANIC-INORGANIC PEROVSKITE BASED PHOTOELECTRIC CONVERSION DEVICE AND METHOD FOR MANUFACTURING THE SAME

TECHNICAL FIELD

This invention generally relates to methods for producing photoelectric conversion devices, and more specifically, to a method for producing organic-inorganic perovskite based photoelectric conversion devices having designed mesoscopic framework using inorganic semiconductor layers.

PRIOR ART AND THE PROBLEM UNDERLYING THE INVENTION

Nowadays, in order to solve a facing energy problem, various researches for energy that can replace existing fossil fuels have been progressed. Energy is the driving force of the development and progress of human society being important basis for national economic development and the improvement of people's living standards. With the large consumption of traditional fossil energy sources, environmental pollution is worsening and the global energy crisis has become increasingly prominent.

Solar cells converting solar energy directly into electricity are the solution to the global energy crisis and represent one important way to reduce environmental pollution. Current silicon-based solar cell technology is the most mature and widely used device. But the purity of the silicon solar cell materials, the demand for crystal, complex process of fabrication, high production costs are drawbacks to incite the development of low-cost and simple preparation fabrication process of new solar cell and to obtain a solar cell with large scale application.

Because a solar cell uses solar energy, being an infinite and environmental-friendly energy source, unlike other energy sources, the solar cell has been in the spotlight due to an energy shortage problem. Since a Si solar cell was developed in 1983; implementing silicon for photovoltaic cells generally requires high product cost due to extensive material and energy consumption. Another type of commercial photovoltaic (PV) cell that has lower material consumption is thin film PV cells such as a-Si, CaTe, CIGS, etc. However, these thin film PV cells generally require a high vacuum manufacturing process, which generally leads to high capital investment and operational expenses.

An alternative solution for solving such a serious energy problem is processable solar cells. Graetzel et al. developed a photoelectric (solar) cell using a photoelectric conversion device called a dye-sensitized solar cell in 1991. This is also called a Graetzel cell using photosensitive dye molecules for generating electron-hole pairs by absorbing visible rays and using a sandwich structure for transferring generated electrons.

Because of its unique crystal structure of $ABX_3$ perovskite materials, said material exhibits long life and high charge mobility, electron and hole carriers, and a large diffusion length. At the same perovskite crystal band suitable position, when a combination of an inorganic semiconductor material can effectively injecting electrons or holes to achieve high efficiency of charge separation.

Recently, organic-inorganic perovskite absorber was initially used as sensitizer to replace dye molecules in the conventional dye-sensitized solar cell (DSSC). Unlike a conventional dye molecule, organic-inorganic perovskites have unique electrical, magnetic, and optical properties, as well as their excellent film processability. Organic-inorganic perovskites are typically made using solution chemistry techniques and high-quality perovskite thin films can often be obtained by simple processing. These hybrid organic-inorganic perovskites materials with superior properties such as a direct band gap, large absorption coefficient, high carrier mobility, and ambipolar charge transport, have attracted much attention for efficient photon-to-electricity energy conversion. Currently, the development of solar cells based on $ABX_3$ perovskite material is rapid. In 2012, by using a perovskite solar cell, a photoelectric conversion efficiency of 9.7% was achieved. By optimizing the fabrication process of such devices, the current energy conversion efficiency has exceeded 17%.

A common organic-inorganic perovskite solar cell comprises a pair of electrodes and perovskite active layer and charge transporting materials disposed there between, in analogy to dye sensitized solar cells (DSSC). The perovskite layer, either with or without mesoporous scaffold, is sandwiched between the electron and hole transport layers (n-type and p-type, respectively). Following light excitation, carriers are created in the perovskite layer and injects negative and positive charge carrier in the respective electron and hole transport materials, which subsequently are collected as photocurrent at the front and back contacts of the cell.

The key component of this class of PV cells is ETL/active layer/HTL multiple layers, which can normally be fabricated by a layer by layer assembly process. This process consists in that electron transport layers (ETL) or hole transport layer (HTL) is firstly fabricated on the substrate followed by active layer and the other charge transport layer. For example, in a typical solid-state DSSC or perovskite solar cell, an electron transporter material (such as titanium dioxide) is in direct electrical contact with the conducting anode and coupled with a dye (or organic-inorganic perovskite) onto the surfaces of the semiconductor solid (e.g. titanium dioxide). Hole transport between the active layer (dye or organic-inorganic perovskite) and the cathode occurs through a hole transport layer disposed there between. Nanocrystalline semiconductor electrode, which can normally be fabricated by several wet chemical methods such as casting, doctor blading, and screen printing as well as different physical methods including sputtering and chemical vapor deposition.

CN103855307A patent discloses a perovskite solar cell and preparation method. The perovskite cell having a hole transport layer, a light absorbing layer perovskite and the electron-transporting layer forms a cell having a high power conversion efficiency. The hole transport layer may be organic or a metal oxide. When organic materials are used, these organic materials are more expensive and the application costs increase. Because the long-term properties of these organic materials are difficult to maintain, subsequent packaging process of battery device and long-term stability of device applications represent a challenge. The film quality and thickness of a metal oxide of the hole transport layer, and the presence of impurities, defects and pinholes within the film will seriously affect the photoelectric conversion efficiency of solar cells. Film thickness between 10 to 1000 nanometers of large solar cell is controlled to avoid rapidly decreased efficiency. The quality and thickness of the film made under usual methods for the synthesis under high vacuum conditions using Molecular beam epitaxy (MBE), Chemical vapor deposition (CVD) or Physical vapor deposition (PVD) are strictly controlled. High quality inorganic metal oxide film formed is made under very strict growing conditions on the growing structure. These controls also increase the manufacturing costs of the solar cell. Further, mesoporous structure in the perovskite hole transport layer solar cells has not yet been reported.

However, the fabrication of hole transport layer is strictly dominated by the prepared active layer which is generally sensitive to temperature, humidity and the solvent. For example, as a result of the organic ammonium cations, the organic-inorganic perovskite decompose at relatively low temperature (<250° C.), which is also easy to decompose in air, moisture and polar solvent. For these reason, organic hole transport materials with excellent film processability become a better choice for this kind of device. However, manufacturing the hole-transportation organic materials (such as spiro-OMeTAD) commonly used in solid-state DSSC or perovskite solar cell is very costly and lack long term stability. On the contrary, inorganic HTMs are more advantaged in respect of cost and durability, such as NiO, CuSCN and CuI. However, inorganic HTMs are uncommon in this class of devices as a hole transport layer for very poor performance, and thus there has been a need for improvement from these aspects.

The present invention addresses the problems of the high cost of organic solar cells fabrication and the use of perovskite demanding, the difficulty of metal oxide perovskite thin film solar cell preparation, to ensure energy conversion efficiency of the perovskite solar cell, to explore new perovskite solar cell structure and preparation methods in order to simplify the manufacturing process, and the reduction costs.

Therefor the present invention addresses to improve a simple preparation of a perovskite based solar cell with lower cost, to provide a convenient use for having high power conversion efficiency of the perovskite solar cell, The present invention addresses the problems depicted above.

SUMMARY OF THE INVENTION

For the deficiencies of the prior art, an object of the present invention is to improve a simple preparation, to provide convenient use of perovskite for high power conversion efficiency of the solar cell in order to resolve the perovskite solar cell preparation problem and high cost.

The inventors surprisingly found that mesoscopic inorganic P-I-N metal oxides framework being a triple-layer scaffold filled by the perovskite active material can work at the same time as an electron transport through the electron transport layer (N-layer) and/or as hole transport through hole transport layer (P-layer). A mesoporous insulating layer (I-layer) is inserted between the electron transport layers (N-layer) and hole transport layer (P-layer) to avoid direct contact between two kinds of carrier transport materials. The whole structure forms a mesoporous inorganic P-I-N metal oxides framework or mesoporous inorganic P-I-N scaffold contained in a ETL/active layer/HTL component.

The present invention also relates to a perovskite solar cell, which comprises a bottom-transparent electrode, a P-I-N mesoporous framework and a negative electrode, wherein said framework is made by a sequentially stacked configuration of n-type semiconductor layer, insulating layer, p-type semiconductor layer; the n-type semiconductor layer, the insulating layer and the p-type semiconductor layer, said layers are mesoporous; and the n-type semiconductor layer, the insulating layer and the p-type mesoporous semiconductor layer are filled with a perovskite material.

Accordingly, it is an objective of the present invention to provide an organic-inorganic perovskite based photoelectric conversion device and a manufacturing method thereof, wherein the light absorption material (organic-inorganic perovskite) is infiltrated in a mesoporous inorganic P-I-N metal oxides framework, which is fabricated by a commercially feasible method.

In an aspect, the invention provides an organic-inorganic perovskite based solar cell comprising a conductive substrate, an ETL/active layer/HTL component, and a negative electrode, wherein the ETL/active layer/HTL component comprises: a mesoporous P-I-N metal oxides framework containing a mesoporous n-type semiconductor layer, a mesoporous insulating layer, a mesoporous p-type semiconductor layer, and an organic-inorganic perovskite light absorbing material.

In one embodiment, the mesoporous n-type semiconductor being the electron transport layer is made of semiconductor particles comprising Si, $TiO_2$, $SnO_2$, ZnO, $Zn_2SnO_4$, $Nb_2O_5$, $WO_3$, $BaTiO_3$ or $SrTiO_3$ or any combination thereof.

In a further embodiment, the mesoporous p-type semiconductor as hole transport layer can be made of semiconductor particles comprising NiO, CuO, CuSCN, CuI, $CuGaO_2$, $CuCrO_2$ or $CuAlO_2$ or any combination thereof.

According to a further embodiment, the mesoporous insulating layer can be made of semiconductor particles comprising $ZrO_2$, $AlO_2O_3$, $SiO_2$, SiC, $Si_3N_4$, $Ca_3(PO_4)_2$ or any combination thereof.

In another embodiment, the conductive substrate is selected from indium tin oxide (ITO) film substrate, fluorine-doped tin oxide (FTO), film substrate, ZnO—$Ga_2O_3$ film substrate, ZnO—$Al_2O_3$ film substrate, or tin-based oxides film substrate.

In a further embodiment, one additional blocking layer is deposited onto the conductive substrate to form an intervening layer between the conductive substrate and the mesoporous inorganic P-I-N scaffold to separate the substrate and the organic-inorganic perovskite material.

In one embodiment, the negative electrode is selected from gold (Au), silver (Ag), aluminum (Al), copper (Cu), platinum (Pt), nickel (Ni), carbon (C).

In a further embodiment, the organic-inorganic perovskite material of the organic-inorganic perovskite based solar cell of the invention is of the formula $CH_3NH_3PbX_mY_{3-m}$, wherein m is an integer from 1 to 3; X and Y is independently selected from iodine (I), bromine (Br), and chlorine (Cl).

In a further aspect, the invention provides a method for manufacturing an organic-inorganic perovskite based solar cell comprising:

a first step of providing mesoporous inorganic P-I-N metal oxides framework comprising coating a conductive substrate by deposition of a mesoporous inorganic N-type semiconductor layer followed by depositing a mesoporous inorganic insulating layer onto said inorganic N-type semiconductor and by depositing a mesoporous inorganic P-type semiconductor layer onto said mesoporous inorganic insulating layer;

a step of filling the mesoporous inorganic P-I-N metal oxides framework by an organic-inorganic perovskite solution followed by a step of forming a negative electrode onto the mesoporous inorganic P-I-N metal oxides framework filled with the organic-inorganic perovskite material; or a step of forming a mesoporous negative electrode onto the mesoporous inorganic P-I-N metal oxides framework without organic-inorganic perovskite material followed by a step of filling the mesoporous inorganic P-I-N metal oxides framework with organic-inorganic perovskite solution.

In an embodiment of the method of the invention, one additional blocking layer is deposited onto the conductive substrate before coating the mesoporous inorganic P-I-N scaffold layer to separate the conductive substrate and the organic-inorganic perovskite material.

In a further embodiment of the method of the invention, the first step of providing mesoporous inorganic P-I-N metal oxides framework further comprises a step of annealing of the deposited mesoporous inorganic P-I-N metal oxides framework for 30-40 minutes at 400-500° C.

In another embodiment of the method of the invention, the step of filling the mesoporous inorganic P-I-N metal oxides framework by the organic-inorganic perovskite solution comprises a further step of annealing the light absorption material for 10-30 minutes at 60-80° C.

In one embodiment of the method of the invention, the negative electrode being in gold (Au) is deposited by thermal evaporation of metal onto the mesoporous inorganic P-I-N metal oxides framework filled with organic-inorganic perovskite material.

In another embodiment of the method of the invention, the negative electrode being in Carbon (C) is deposited by printing onto the mesoporous inorganic P-I-N metal oxides framework after that said mesoporous inorganic P-I-N metal oxides framework is filled with organic-inorganic perovskite material.

In a further embodiment of the method of the invention, the negative electrode is porous Carbon (C) being deposited by printing onto the mesoporous inorganic P-I-N metal oxides framework before filling with the organic-inorganic perovskite solution.

Further aspects and preferred embodiments of the invention are detailed herein below and in the appended claims. Further features and advantages of the invention will become apparent to the skilled person from the description of the preferred embodiments given below.

DETAILED DESCRIPTION OF THE PREFERRED EMBODIMENTS

Figure 1:
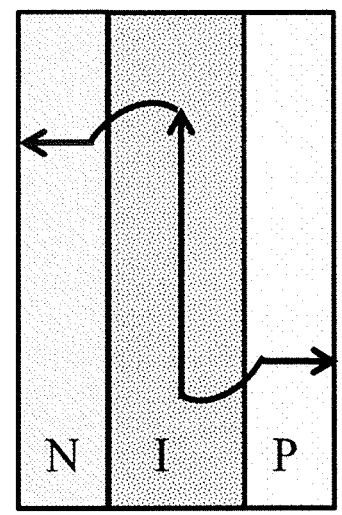
FIG. 1 is a schematic view of a mesoporous inorganic P-I-N scaffold or mesoporous inorganic P-I-N metal oxides framework comprising mesoporous inorganic n-type semiconductor layer (N), mesoporous insulating layer (I) and mesoporous inorganic p-type semiconductor layer (P).
Figure 2:
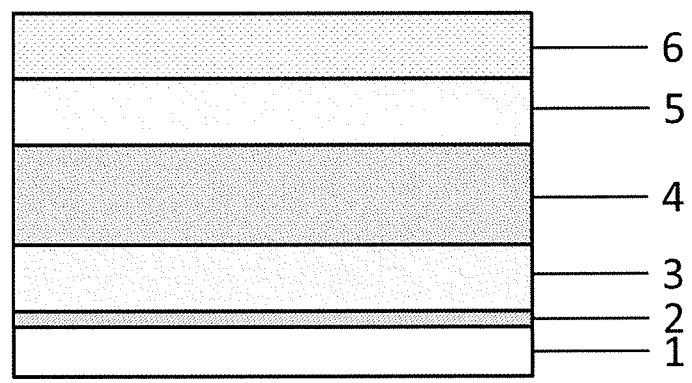
FIG. 2 is a schematic view of a perovskite solar cell with mesoporous inorganic P-I-N scaffold or mesoporous inorganic P-I-N metal oxides framework comprising a transparent conductive substrate (1), an additional blocking layer being dense layer (2), a mesoporous inorganic n-type semiconductor layer (3), a mesoporous insulating layer (4), an inorganic mesoporous p-type semiconductor layer (5), a negative electrode (6) being used as counter electrode.

The present invention relates to an efficient perovskite solar cell being fabricated from ETL/active layer/HTL component comprising a mesoporous inorganic P-I-N metal oxides framework or scaffold filled with an organic-inorganic perovskite light absorption material. Thus, the present invention provides a novel ETL/active layer/HTL component, which may be used in photoelectric conversion devices, preferably wherein the devices are free of other organic hole transport material.

The present invention also relates to a solar cell perovskite, which sequentially comprises a bottom-transparent electrode, a P-I-N mesoporous framework and a P-I-N electrode, and wherein said mesoporous framework comprises the n-type semiconductor layer, an insulating layer, p-type semiconductor layer under a sequentially stacked configuration, the n-type semiconductor layer, the insulating layer and the p-type semiconductor layer containing mesopores, the n-type semiconductor layer, the insulating layer and the p-type mesoporous semiconductor layer being filled with a perovskite material. A dense layer for electron or hole barrier is provided between the transparent electrode and the P-I-N mesoporous framework.

In addition, the inorganic charge transport layers including ETL and HTL are prefabricated before the preparation of active layer, which makes the processing of charge transport layer more easily. Especially, the hole transport layer is a mesoporous inorganic p-type semiconductor material, which reduces the costs and simplify the preparation.

Thus the present invention provides an organic-inorganic perovskite based solar cell, which comprises a conductive substrate, an ETL/active layer/HTL component, and a negative electrode.

The ETL/active layer/HTL component comprises a mesoporous n-type semiconductor layer, a mesoporous insulating layer, a mesoporous p-type semiconductor layer, and an organic-inorganic perovskite absorbing material. Said mesoporous layers are filled with organic-inorganic perovskite absorbing material.

The mesoporous n-type semiconductor as electron transport layer is an inorganic material. Said mesoporous n-type semiconductor can be made of semiconductor particles. Suitable semiconductor particles comprise material selected from Si, $TiO_2$, $SnO_2$, ZnO, $Zn_2SnO_4$, $Nb_2O_5$, $WO_3$, $BaTiO_3$ or $SrTiO_3$ or any combination thereof. They may comprise material selected from $TiO_2$, $SnO_2$, ZnO, $Zn_2SnO_4$, $Nb_2O_5$, $WO_3$, $BaTiO_3$, $SrTiO_3$, Preferably, the semiconductor particles are selected from $TiO_2$ and ZnO most preferably $TiO_2$. The average diameter of the semiconductor particles may be from 10 to 200 nm. Preferably, the average diameter of the semiconductor particles is from 10 to 100 nm, 10 to 50 nm. Furthermore, the thickness of the mesoporous semiconductor layer is in the range from 50 nm to 1000 nm, preferably from 50 to 600 nm.

The mesoporous p-type semiconductor as hole transport layer can be made of semiconductor particles. Suitable semiconductor particles comprise material selected from NiO, CuO, CuSCN, CuI, $CuGaO_2$, $CuCrO_2$ or $CuAlO_2$ or any combination thereof. Preferably, the semiconductor particles are selected from NiO. The average diameter of the semiconductor particles may from 10 to 500 nm, from 10 to 400 nm. Preferably, the average diameter of the semiconductor particles is from 10 to 100 nm. Furthermore, the thickness of the mesoporous semiconductor layer is in the range from 50 nm to 1000 nm, preferably from 100 to 800 nm.

The mesoporous insulating layer can be made of semiconductor particles. Suitable semiconductor particles comprise a material selected from $ZrO_2$, $Al_2O_3$, $SiO_2$, SiC, $Si_3N_4$, $Ca_3(PO_4)_2$ or any combination thereof. Preferably the semiconductor particles are selected from $ZrO_2$, and $Al_2O_3$. The average diameter of the semiconductor particles may be from 10 to 500 nm, from 10 to 400 nm. Preferably, the average diameter of the semiconductor particles is from 10 to 100 nm. Furthermore, the thickness of the mesoporous semiconductor layer is in the range from 50 nm and 1000 nm, preferably from 100 to 800 nm.

The conductive substrate is selected from indium tin oxide (ITO) film substrate, fluorine-doped tin oxide (FTO) film substrate, $ZnO$—$Ga_2O_3$ film substrate, $ZnO$—$Al_2O_3$ film substrate, or tin-based oxides film substrate. Preferably the transparent conductive substrate is a glass substrate covered by a fluorine-doped tin oxide (FTO). The specific examples of the transparent substrate include, but are not limited to, transparent inorganic substrates, such as quartz and glass; transparent plastic substrates, such as poly(ethylene terephthalate) (PET), poly(ethylene 2,6-naphthalate) (PEN), polycarbonate (PC), polyethylene (PE), polypropylene (PP), and polyimide (PI). Preferably, the material of the transparent substrate is glass.

One additional blocking layer or dense layer is optional and is deposited onto the conductive substrate to be an intervening layer between the conductive substrate and the mesoporous inorganic P-I-N scaffold or metal oxides framework composing the ETL/active layer/HTL component to separate the substrate and the perovskite material. The dense layer or additional blocking layer comprises metal oxide selected from $TiO_2$, ZnO and NiO The negative electrode is selected from gold (Au), silver (Ag), aluminum (Al), copper (Cu), platinum (Pt), nickel (Ni), carbon (C), or the like. Furthermore, the metal negative electrode is gold (Au) with a thickness of range between 50 nm and 200 nm. Additionally, the negative electrode is porous Carbon (C) with a thickness of range between 5 um and 15 um.

The organic-inorganic perovskite material is of the formula $CH_3NH_3PbX_mY_{3-m}$, wherein m represents an integer of 1 to 3; X and Y represent at least one of iodine (I), bromine (Br), and chlorine (Cl). Preferably the organic-inorganic perovskite material is $CH_3NH_3PbI_3$.

The present invention also relates a method for manufacturing a perovskite solar cell, and the method is presented as follows.

First, a conductive substrate is coated by deposition of a mesoporous inorganic N-type semiconductor layer, and said deposition being followed by successive depositions of a mesoporous inorganic insulating layer and of a mesoporous inorganic P-type semiconductor layer. Thus a mesoporous inorganic P-I-N metal oxides framework of scaffold is obtained. In a further step, an organic-inorganic perovskite solution is deposited into the mesoporous inorganic P-I-N metal oxides framework and this step is followed by the formation of a negative electrode onto the mesoporous inorganic framework filled with the perovskite material, so as to form an organic-inorganic perovskite solar cell. Or a porous negative electrode is formed onto the mesoporous inorganic P-I-N metal oxides framework without perovskite material and this step is followed by the filling of said framework with the perovskite material, so as to form an organic-inorganic perovskite solar cell.

The semiconductor particles are prepared in a form of a paste or slurry, and then the transparent conductive substrate is coated with the paste. Additionally, the coating can be held for one time or many times, in order to obtain a mesoporous semiconduct layer with a suitable thickness. The mesoporous inorganic P-I-N metal oxides framework consists of multiple layers scaffold, wherein each layer of the multiple layers scaffold is formed by semiconductor particles with the same or different diameters. For example, the N-type $TiO_2$ semiconductor particles with a diameter from 10 to 50 nm are coated in a thickness from 50 to 600 nm onto the conductive substrate or the additional blocking layer. Then the $Al_2O_3$ semiconductor particles with a diameter from 10 to 100 nm are coated in a thickness from 100 to 800 nm thereon. Further then, a P-type NiO semiconductor particles with a diameter from 10 to 100 nm are coated in a thickness of 100 to 800 nm.

One additional blocking layer is deposited on the conductive substrate before the coating of the mesoporous inorganic metal oxides scaffold layer to separate the substrate and the organic-inorganic perovskite material.

The deposition of mesoporous inorganic semiconductor layers involves a method selected from spin coating, roll coating, printing, ink-jet printing, lithography, stamping and any combination thereof.

After depositing the mesoporous inorganic P-I-N metal oxides framework, said mesoporous inorganic P-I-N metal oxides framework is annealed for 30-40 minutes at 400-500° C.

The step of filling perovskite solution into mesoporous inorganic layers may be performed by deposition with a method selected from dipping, spin coating, or drop casting.

After the filling of the mesoporous inorganic layers with the organic-inorganic perovskite solution, the light absorption material is annealed for 10-30 minutes at 60-80° C.

The invention also relates to a method of producing a perovskite solar cell, comprising the steps of:

1) preparing a P-I-N mesoporous framework on a transparent conductive substrate, comprising:
uniformly coating of the slurry of particles of n-type semiconductor material of size from 10-100 nm after the formation of a transparent conductive substrate (1) coated by a spin coating method or a screen printing method onto the transparent conductive substrate and drying the slurry to remove the solvent to form n-type semiconductor layer having a thickness from 50-600 nm; uniformly coating the slurry of particles of the insulating material having a size from 10-400 nm by a spin coating method or a screen printing onto the n-type semiconductor layer, and drying the slurry to remove the solvent to form an insulating layer having a thickness from 100-800 nm; uniformly coating the slurry of particles of by p-type semiconductor material having a size from 10-400 nm by spin coating method or a screen printing method, and drying the slurry to remove the solvent to form a p-type semiconductor layer having a thickness from 100-800 nm; sintering the slurries forming the P-I-N structure/framework to remove the original organic linking agent at 400 to 500° C. to form mesopores in the n-type semiconductor layer, the insulating layer and the p-type semiconductor layer, whereby mesoporous P-I-N structure is formed onto the transparent conductive substrate;

Or, uniformly coating of the slurry of particles of p-type semiconductor material of size from 10-400 nm after the formation of a transparent conductive substrate (1) coated by a spin coating method or a screen printing method onto the transparent conductive substrate and drying the slurry to remove the solvent to form p-type semiconductor layer having a thickness from 100-800 nm; uniformly coating the slurry of particles of the insulating material having a size from 10-400 nm by a spin coating method or a screen printing onto the n-type semiconductor layer, and drying the slurry to remove the solvent to form an insulating layer having a thickness from 100-800 nm; uniformly coating the slurry of particles of by n-type semiconductor material having a size from 10-100 nm by spin coating method or a screen printing method, and drying the slurry to remove the solvent to form a n-type semiconductor layer having a thickness from 50-600 nm; sintering the slurries forming the P-I-N structure/framework to remove the original organic linking agent at 400 to 500° C. to form mesopores in the n-type semiconductor layer, the insulating layer and the p-type semiconductor layer, whereby mesoporous P-I-N structure is formed onto the transparent conductive substrate;

2) filling with perovskite materials, and preparing the electrode layer, comprising:

filling by spin coating or drop coating perovskite material into the n-type semiconductor layer, insulating layer and p-type semiconductor layers mesoporous framework (P-I-N framework) and preparing an electrode layer onto the P-I-N mesoporous framework;

or preparing the porous electrode layer onto the P-I-N mesoporous framework, and filling by spin coating or drop coating perovskite materials into the mesoporous P-I-N framework.

The solid content of the inorganic nanoparticles represent 18 wt %, the appropriate inorganic nanoparticles in an organic linking agent being constituted by the slurry of the p-type semiconductor material, the slurry of n-type semiconductor material and the insulating material in solvent, wherein the solvent is terpineol and the organic linking agent being ethyl cellulose. The mass ratio of the inorganic nanoparticles and the organic linking agent is 1:0.6.

The method of the invention further comprises, before step 1), a step of depositing a dense layer of electrons or holes blocking layer by spray pyrolysis method onto the transparent conductive substrate.

In the step 2) of the method of the invention, the porous electrode layer is selected from a porous carbon electrode or a metal electrode.

In one embodiment of the present invention, the negative electrode gold (Au) is deposited by thermal evaporation of metal on the mesoporous inorganic P-I-N metal oxides framework filled with perovskite material.

The negative electrode Carbon (C) is deposited by printing onto the mesoporous inorganic P-I-N metal oxides framework, which can be already filled with the organic-inorganic perovskite material. Or the negative electrode is porous Carbon (C) is deposited by printing onto the mesoporous inorganic P-I-N metal oxides framework before being filled with the organic-inorganic perovskite material; the filling process with the organic-inorganic perovskite solution can be carried through the porous Carbon (C) negative electrode.

More and more solar panel structures use perovskite materials, which involves the need to strictly control the film quality and film thickness as well as the process maturity of the hole transport layer being organic materials. All these organic materials are expensive and increase the costs of solar devices. Further the long-term stability of these organic materials as well as solar devices based on these materials represent challenges for the preparation of said device. The use of inorganic materials in the preparation hole transport layer is difficult and requires specific equipment and conditions to obtain high quality, appropriate film thickness, which increases the production cost of solar cells. The invention solves the perovskite solar cell preparation process complexity, high cost of production of technical problems. Using the mesoporous P-I-N framework and, in particular, a hole transport layer using a mesoporous inorganic material for the p-type semiconductor reduces the cost of raw materials, and also lowers the requirements for film quality and thickness usually needed for the hole transport layer. It only requires the use of simple inexpensive method such as spin-coating method or a screen printing method to obtain the mesoporous structures, simplifying the production process and improve the yield by reducing production costs. Using mesoporous structure for the hole transport layer suppresses carrier recombination effects inside the solar cell, effectively improving the energy conversion efficiency of solar cells up to 14% and simplifying the perovskite solar cell preparation process, reducing the costs while ensuring the perovskite high energy conversion efficiency of solar cells and creating good prospects for industrial application.

The mesoporous inorganic P-I-N scaffold filled with organic-inorganic perovskite includes a mesoporous inorganic n-type semiconductor layer (3), a mesoporous inorganic p-type semiconductor (5), and a mesoporous inorganic insulating layer (4) inserts between layer (3) and layer (5). The organic-inorganic perovskite is infiltrated into the mesoporous scaffold as a light absorption material. The key element of the present invention is that the mesoporous inorganic charge transport layers are prepared before being filled by the light absorption material (organic-inorganic perovskite).

The mesoporous inorganic n-type semiconductor layer (3) comprises a material which can be selected from $TiO_2$, $SnO_2$, $ZnO$, $Zn_2SnO_4$, $Nb_2O_5$, $WO_3$, $BaTiO_3$ or $SrTiO_3$ or any combination thereof.

The mesoporous inorganic p-type semiconductor layer (5) comprises a material which can be selected from NiO, CuO, CuSCN, CuI, $CuGaO_2$, $CuCrO_2$ or $CuAlO_2$ or any combination thereof. The mesoporous inorganic insulating layer 4 can be selected from $ZrO_2$, $AlO_2O_3$, $SiO_2$, SiC, $Si_3N_4$, $Ca_3(PO_4)_2$ or any combination thereof.

For example, $TiO_2$, $Al_2O_3$, NiO nanocrystalline slurry with a particle size range between 10 nm and 100 nm can be used in the present invention. Furthermore, the mesoporous semiconductor layers can be formed by using a spin coating process or a printing process with a film thickness range between 50 nm and 1000 nm.

The light absorption material filled in mesoporous semiconductor layers is made of organic-inorganic perovskite represented by the formula $CH_3NH_3PbX_mY_{3-m}$, wherein m represents an integer of 1 to 3; X and Y represent at least one of iodine (I), bromine (Br), and chlorine (Cl).

The conductive substrate (1) can be independently selected from FTO glass substrate, ITO glass substrate, AZO glass substrate or IZO glass substrate. For example, FTO glass substrate can be used in the present invention.

One additional blocking layer (2) may be deposited as an intervening layer between the conductive substrate, which may be any one of the aforementioned transparent substrate, e.g. FTO glass substrate, and the mesoporous inorganic P-I-N metal oxides framework, said framework being filled or not with organic-inorganic perovskite material. Said additional blocking layer is to separate the conductive substrate, e.g. FTO glass substrate, and the perovskite material.

In one embodiment, the additional blocking layer (2) as being a hole blocking layer is formed onto the FTO conductive substrate by spray pyrolysis or spin coating. The thickness of the additional blocking layer (2) is from 30-100 nm. For example, a 60 nm thick $TiO_2$ may be used.

In one embodiment, the negative electrode (6) is formed onto the hole transport layer (5) by vapor deposition. The negative electrode (6) can be selected from metals selected from gold (Au), silver (Ag), aluminum (Al), copper (Cu), platinum (Pt), nickel (Ni), carbon (C) or the like. The thickness of the negative electrode (6) is from 50 to 150 nm. For example, a 100 nm thick gold (Au) metal coating may be used.

The negative electrode (6) is formed onto the hole transport layer (5) by screen printing. In a specific embodiment, the negative electrode (6) is porous carbon electrode. The thickness of the negative electrode (6) is from 5 to 15 μm. A carbon electrode with a thickness of 10 μm may be used in the present invention.

The present invention further provides a method for manufacturing a perovskite solar cell, comprising a first step, wherein a conductive substrate is coated with a mesoporous inorganic N-type semiconductor layer by deposition, followed by the deposition of a mesoporous inorganic insulating layer onto the N-type semiconductor and a mesoporous inorganic P-type semiconductor layer onto said inorganic insulating layer to obtain the mesoporous inorganic P-I-N metal oxides framework. Subsequently, the organic-inorganic perovskite solution is deposited or filled into the mesoporous inorganic P-I-N metal oxides framework, followed by a step wherein a negative electrode is formed onto the mesoporous inorganic P-I-N metal oxides framework filled with the organic-inorganic perovskite material; Or subsequently to the step of the deposition of the mesoporous inorganic P-I-N metal oxides framework, a porous negative electrode is formed onto the mesoporous inorganic P-I-N metal oxides framework free of the organic-inorganic perovskite material, followed by a step wherein said framework is filled by the organic-inorganic perovskite material is.

Further, the mesoporous inorganic P-I-N metal oxides framework is annealed for 30-40 minutes at 400-500° C. before the filling process with the organic-inorganic perovskite material.

Furthermore, the perovskite solution used as light absorption material is filled into the mesoporous inorganic layers of the mesoporous inorganic P-I-N metal oxides framework, light absorption material is annealed for 10-30 minutes at 60-80° C.

Finally, in a particular embodiment, a negative electrode being in gold (Au) is deposited by thermal evaporation onto the mesoporous inorganic P-I-N metal oxides framework filled with perovskite material.

In another particular embodiment, a negative electrode being in Carbon (C) is deposited by printing on the mesoporous inorganic P-I-N metal oxides framework being filled with organic-inorganic perovskite material and annealed for 10-30 minutes at 80-100° C.

In a further particular embodiment, the negative electrode is porous Carbon (C) is deposited by printing onto the mesoporous inorganic P-I-N metal oxides framework free of organic-inorganic perovskite material, and before the filling process of perovskite, the multiple-layers of said framework is annealed for 30-40 minutes at 400-500° C.

The organic-inorganic perovskite based solar cell may comprise a dense layer of metal oxide selected from $TiO_2$, ZnO, NiO; a mesoporous inorganic n-type semiconductor layer comprising at least one of a mesoporous material selected from $TiO_2$, $SnO_2$, ZnO, $Zn_2SnO_4$, $Nb_2O_5$, $WO_3$, $BaTiO_3$, $SrTiO_3$; a mesoporous insulating barrier layer comprising at least one of a mesoporous material selected from $ZrO_2$, $Al_2O_3$, $SiO_2$, SiC, $Si_3N_4$, $Ca_3(PO_4)_2$; a p-type semiconductor mesoporous layer comprising at least one of a mesoporous material selected from NiO, CuO, CuSCN, CuI, $CuGaO_2$, $CuCrO_2$ or $CuAlO_2$; a metal electrode layer comprising a metal selected from Au, Ag and Al or an electrode being a conductive carbon mesoporous or a pair thereof; and the multilayers of mesoporous material may be filled with one or more perovskites of formula $(CH_3NH_3)PbX_mY_{3-m}$, wherein X, Y=Cl, Br, I; m=0 to 3, preferably perovskite is iodine lead methylamine ($CH_3NH_3PbI_3$).

The organic-inorganic perovskite based solar cell may be obtained after the preparation by overlaying the mesoporous inorganic n-type semiconductor layer, the mesoporous insulating barrier layer and the mesoporous inorganic p-type semiconductor layer by spin coating method or screen printing method or the like and sintering said mesoporous multilayers, sintering at temperatures from 400-500° C. for 30 min.

Porous carbon conductive electrode is prepared by screen printing on the multi-layer film and dried by sintering at temperature from 400-500° C. for 30 min. The thickness of said electrode is from 2-10 μm.

The metal electrode is prepared by vapor deposition method at a high vacuum (≤10-5 Pa) condition. The thickness of said metal electrode is from 50-200 nm.

The present invention is described more concretely with reference to the following examples, which, however, are not intended to restrict the scope of the invention.

EXAMPLES

Example 1

Preparation of a Mesoporous Inorganic P-I-N Metal Oxides Framework

The substrate of the device was a glass substrate covered with fluorine-doped tin oxide (FTO), wherein the thickness of the glass substrate was 4 mm and the electric resistance of the glass substrate is 10Ω. A blocking layer of $TiO_2$ was deposited on the FTO glass by spray pyrolysis deposition with di-isopropoxytitanium bis(acetyl acetonate) (TiDIP, 75% in isopropanol, Aldrich) solution at 450° C. A mesoporous inorganic N-type semiconductor layer was coated by screen printing method using a paste containing $TiO_2$ particles with diameter of 20 nm (DSL. 18NR-T, 20 nm, Dyesol, Austrilia) for one time or several times. The thickness of the $TiO_2$ layer was 400 nm, and then dried in 125° C. for 10 min. Then, a mesoporous inorganic insulating layer was coated by the same screen printing method using a paste containing $Al_2O_3$ particles with diameter of 20 nm (Aladdin, 20 nm, China). The thickness of the $TiO_2$ layer was 400 nm, and then dried in 125° C. for 10 min. Additionally, a mesoporous inorganic P-type layer was coated by the same screen printing method using a paste containing NiO particles with diameter of 20 nm (Inframat, 20 nm, USA), wherein the thickness of the NiO layer was 600 nm. Finally, the coated glass substrate was sintered at 400-500° C. for 30 min, and the thickness of the mesoporous inorganic P-I-N metal oxides framework was 1.4 μm.

Example 2

Preparation of a Mesoporous Inorganic P-I-N Metal Oxides Framework

The process for preparing the mesoporous inorganic P-I-N metal oxides framework of the present embodiment was the same as that described in Example 1, except that the $TiO_2$ particles was substituted with the ZnO particles with diameter of 10 nm and the thickness of ZnO layer was 200 nm. Then, the coated glass substrate was sintered at 500° C. for 30 min, and the thickness of the mesoporous inorganic P-I-N metal oxides framework was 1.2 μm.

Example 3

Preparation of a Mesoporous Inorganic P-I-N Metal Oxides Framework

The process for preparing the mesoporous inorganic P-I-N metal oxides framework of the present embodiment was the same as that described in Example 1, except that the $Al_2O_3$ particles was substituted with the $ZrO_2$ particles with diameter of 50 nm and the thickness of $ZrO_2$ layer was 600 nm. Then, the coated glass substrate was sintered at 500° C. for 30 min, and the thickness of the mesoporous inorganic P-I-N metal oxides framework was 1.6 μm.

Example 4

Preparation of a Mesoporous Inorganic P-I-N Metal Oxides Framework

The process for preparing the mesoporous inorganic P-I-N metal oxides framework of the present embodiment was the same as that described in Example 1, except that the size of NiO particles was change to 50 nm and the thickness of NiO layer was 1000 nm. Then, the coated glass substrate was sintered at 500° C. for 30 min, and the thickness of the mesoporous inorganic P-I-N metal oxides framework was 1.8 μm.

Example 5

Preparation of a Perovskite Solar Cell

The filling of $CH_3NH_3PbI_3$ into the mesoporous framework prepared by Example 1 was carried out by a two-step deposition technique. At the beginning, $PbI_2$ solution (32 wt % in DMF) was dropped into the mesoporous framework followed by annealing at 70° C. for 30 min. In the second step, the cell was dipped into $CH_3NH_3I$ solution (10 mg/ml in isopropanol) for 20-30 sec, and then annealed at 70° C. for another 30 min. During the dip and the annealing, the $CH_3NH_3PbI_3$ was formed, indicated by the dark brown color of the electrode. After the negative electrode was deposited by evaporating 100 nm of gold (Au) under pressure of $10^{-5}$ Torr, a perovskite solar cell of the present embodiment was obtained.

Example 6

Preparation of a Perovskite Solar Cell

The filling of $CH_3NH_3PbI_3$ into the mesoporous framework prepared by Example 1 was carried out by a two-step deposition technique. At the beginning, $PbI_2$ solution (32 wt % in DMF) was dropped into the mesoporous framework followed by annealing at 70° C. for 30 min. In the second step, the cell was dipped into $CH_3NH_3I$ solution (10 mg/ml in isopropanol) for 20-30 sec, and then annealed at 70° C. for another 30 min. During the dip and the annealing, the $CH_3NH_3PbI_3$ was formed, indicated by the dark brown color of the electrode. Finally, devices were completed by depositing commercial carbon paste on top of the perovskite film by doctor-blading technique. After drying at 100° C. for 30 min, a perovskite solar cell of the present embodiment was obtained.

Example 7

Preparation of a Perovskite Solar Cell

Porous carbon negative electrode (carbon black/graphite: 4/1) was subsequently prepared by screen printing on the mesoporous framework prepared by Example 1 before the filling of perovskite. The coated glass substrate was sintered at 400-500° C. for 30 min, and the thickness of the porous carbon negative electrode was 10 μm. Then the filling of $CH_3NH_3PbI_3$ into the mesoporous framework prepared by Embodiment 1 was carried out by a two-step deposition technique. At the beginning, $PbI_2$ solution (32 wt % in DMF) was dropped into the mesoporous framework through the upper porous carbon electrode and then followed by annealing at 70° C. for 30 min. In the second step, the cell was dipped into $CH_3NH_3I$ solution (10 mg/ml in isopropanol) for 10-20 min. During the dip, the $CH_3NH_3PbI_3$ was formed, indicated by the dark brown color of the electrode. After drying at 60° C. for 20-30 min, a perovskite solar cell was obtained.

Example 8

Preparation of a Perovskite Solar Cell

The process for preparing the perovskite solar cell of the present embodiment was the same as that described in Example 7, except that the mesoporous framework prepared by Example 1 was substituted with the mesoporous framework prepared by Example 2.

Example 9

Preparation of a Perovskite Solar Cell

The process for preparing the perovskite solar cell of the present embodiment was the same as that described in Example 7, except that the mesoporous framework prepared by Example 1 was substituted with the mesoporous framework prepared by Example 3.

Example 10

Preparation of a Perovskite Solar Cell

The process for preparing the perovskite solar cell of the present embodiment was the same as that described in Example 7, except that the mesoporous framework prepared by Example 1 was substituted with the mesoporous framework prepared by Example 4.

The short circuit current ($J_{SC}$), open circuit voltage ($V_{OC}$), filling factor (FF), photoelectric conversion efficiency (PCE), and incident photon-to-current conversion efficiency (IPCE) of the perovskite solar cells prepared by Embodiments 5-10 were measured under the illumination of AM 1.5 stimulated light. The testing results are shown in the following Table 1.

TABLE 1

| Perovskite solar cell | $J_{SC}$ (mA cm$^{-2}$) | $V_{OC}$ (mV) | FF | PCE (%) |
|---|---|---|---|---|
| Example 5 | 16.51 | 904 | 0.70 | 10.90 |
| Example 6 | 16.50 | 902 | 0.71 | 10.57 |
| Example 7 | 19.62 | 915 | 0.76 | 13.65 |
| Example 8 | 18.28 | 923 | 0.72 | 12.14 |
| Example 9 | 17.56 | 916 | 0.71 | 11.41 |
| Example 10 | 17.22 | 908 | 0.70 | 10.95 |

Referring to Table 1, testing results of the Examples 5-7 discloses comparison of photoelectronic performance parameters of the perovskite solar cell with different negative electrode 6. It can be seen that the embodiment 5 and 6, wherein gold (Au) or carbon (C) electrode is deposited by evaporating or doctor-blading technique after the perovskite has been filled the mesoporous inorganic P-I-N metal oxides framework, both have lower photoelectric performance characteristics compared with the Example 7. In Example 7, the porous carbon electrode is directly deposited on the mesoporous framework before the perovskite filling. The reason of the performance difference of the above-mentioned embodiments is that the postprocessing of negative electrode on the active component (ETL/active layer/HTL) has negative effects on the organic-inorganic perovskite, which cause a relatively lower photoelectronic performance of the devices.

Figure 3:
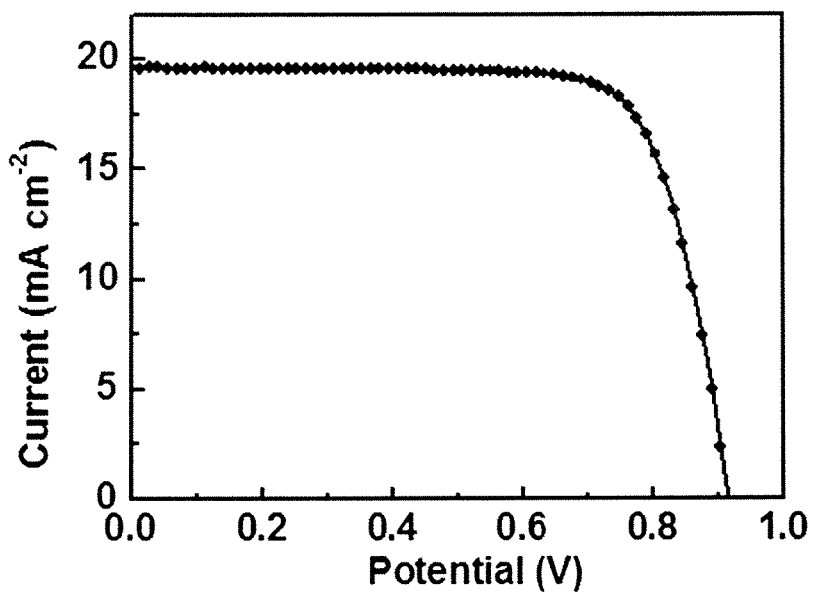
FIG. 3 is a current density-voltage (J-V) curve of the perovskite solar cell with mesoporous inorganic P-I-N scaffold filled with organic-inorganic perovskite ($TiO_2/Al_2O_3/NiO/(CH_3NH_3PbI_3)$).

It can be seen from the results given in Table 1 that photoelectric performance characteristics of devices of embodiment 7-10 have relatively good performance, especially TiO$_2$/Al$_2$O$_3$/NiO/C(CH$_3$NH$_3$PbI$_3$) of embodiment 7 has preferable values of V$_{OC}$=915 mV, J$_{SC}$=19.62 mA cm$^{-2}$, FF=0.76 and PCE=13.65%. FIG. 3 shows the current density-voltage (J-V) curve of the perovskite solar cell with TiO$_2$/Al$_2$O$_3$/NiO as mesoporous inorganic P-I-N metal oxides framework with a thickness of 1.4 µm. The reason of the performance difference of the above-mentioned embodiments is that the intrinsic characteristics of semiconductor such as energy level, electricity, and optical property as well as the particle size and film thickness will influence the photoelectric performance of the devices.

Figure 4:
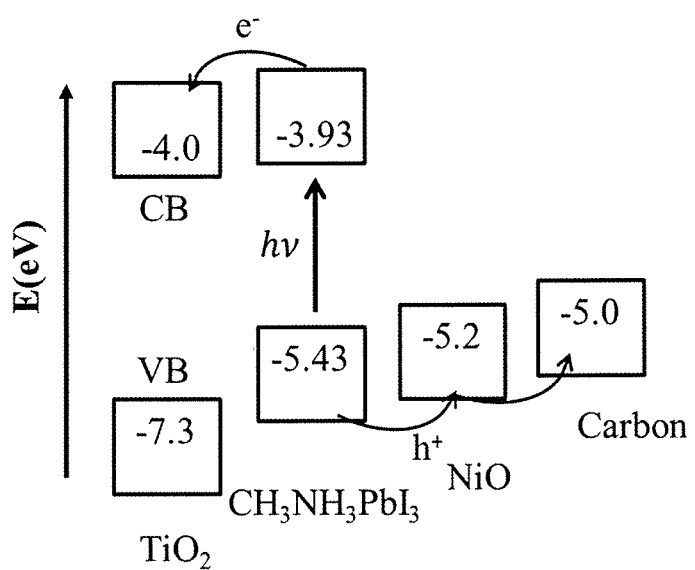
FIG. 4 is energy band diagrams of each layer of a photoelectric conversion device having mesoporous inorganic $TiO_2/Al_2O_3/NiO$ scaffold filled with organic-inorganic perovskite ($CH_3NH_3PbI_3$).

FIG. 4 shows energy band diagrams of each layer of a device having FTO/TiO$_2$/Al$_2$O$_3$/NiO/C(CH$_3$NH$_3$PbI$_3$) component the light is absorbed by the organic-inorganic perovskite, the conduction and valence permitting electron injection and hole transportation to the TiO$_2$ and to the NiO layer, respectively. Following light excitation, carriers are created in the perovskite light absorption material (CH$_3$NH$_3$PbI$_3$) and injects negative and positive charge carrier in the respective electron transport layer (TiO$_2$) and hole transport layer (NiO), which subsequently are collected as photocurrent at the front (FTO) and back (C) contacts of the cell. For the insulating layer Al$_2$O$_3$, charge injection cannot be happened because the mismatch of energy band, which is serve as insulating layer to avoid the direct contact between electron transport layer TiO$_2$ (ETL) and electron transport layer NiO (HTL).

Figure 5A:
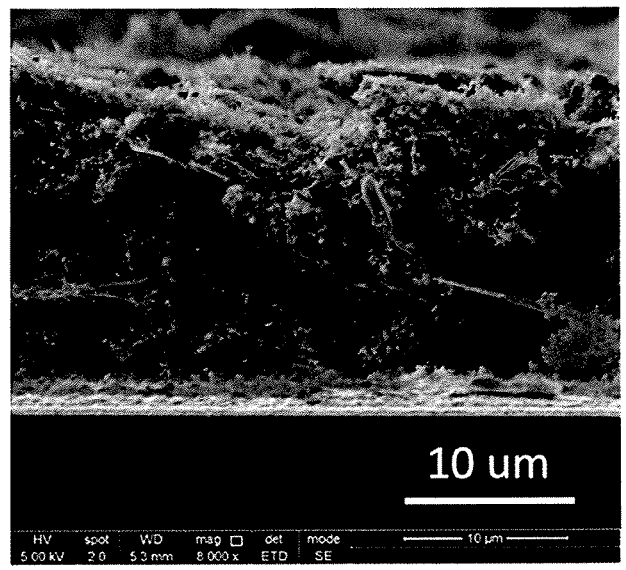
FIG. 5 shows scanning electron microscopy (SEM) pictures (A) of a surface morphology of organic-inorganic perovskite material, (B) of the cross-section of the mesoporous inorganic P-I-N scaffold filled with organic-inorganic perovskite.
Figure 5B:
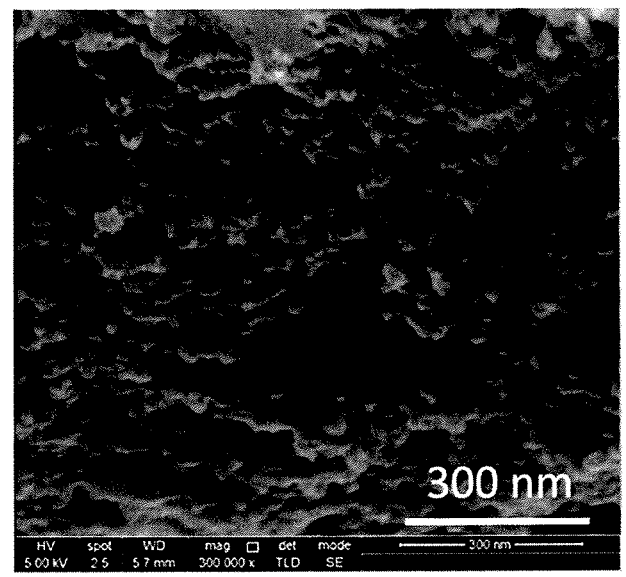

Furthermore, FIG. 5A is a cross-sectional scanning electron microscopy (SEM) photography of the FTO/TiO$_2$/Al$_2$O$_3$/NiO/C architecture which the FTO glass substrate is coated with a mesoporous inorganic TiO$_2$/Al$_2$O$_3$/NiO metal oxides framework combined with a porous carbon electrode, which is prepared by screen printing. The film thickness of the mesoporous inorganic P-I-N metal oxides framework is 1.2-1.6 µm, and the thickness of the porous carbon electrode is 10-12 µm. FIG. 5B is a cross-sectional scanning electron microscopy (SEM) photograph of the mesoporous TiO$_2$/Al$_2$O$_3$/NiO framework filled with perovskite. The filling of CH$_3$NH$_3$PbI$_3$ into the mesoporous framework is carried out by the two-step deposition technique, it can be seen that continuous organic-inorganic perovskite absorption layer is formed in mesoporous of inorganic framework.

Although the present invention has been explained in relation to its preferred embodiment, it is to be understood that many other possible modifications and variations can be made without departing from the scope of the invention as hereinafter claimed.

The invention claimed is:

1. An organic-inorganic perovskite based solar cell comprising a conductive substrate, an ETL/active layer/HTL component, and a negative electrode, wherein the ETL/active layer/HTL component is disposed between the conductive substrate and the negative electrode, and the ETL/active layer/HTL component comprises:
   a mesoporous P-I-N framework containing a mesoporous n-type semiconductor layer, a mesoporous insulating layer, and a mesoporous p-type semiconductor layer; and
   an organic-inorganic perovskite light absorbing material;
   wherein:
   the mesoporous n-type semiconductor layer is disposed on the conductive substrate;
   the mesoporous insulating layer is disposed between the mesoporous n-type semiconductor layer and the mesoporous p-type semiconductor layer;
   the mesoporous p-type semiconductor layer is in contact with the negative electrode;
   the organic-inorganic perovskite light absorbing material is present in mesopores of the mesoporous n-type semiconductor layer;
   the organic-inorganic perovskite light absorbing material is present in mesopores of the mesoporous insulating layer; and
   the organic-inorganic perovskite light absorbing material is present in mesopores of the mesoporous p-type semiconductor layer.

2. The organic-inorganic perovskite based solar cell of claim 1, wherein the mesoporous n-type semiconductor being the electron transport layer is made of semiconductor particles selected from the group consisting of Si, TiO$_2$, SnO$_2$, ZnO, Zn$_2$SnO$_4$, Nb$_2$O$_5$, WO$_3$, BaTiO$_3$, SrTiO$_3$, and a mixture thereof.

3. The organic-inorganic perovskite based solar cell of claim 1, wherein the mesoporous p-type semiconductor as hole transport layer is made of semiconductor particles selected from the group consisting of NiO, CuO, CuSCN, CuI, CuGaO$_2$, CuCrO$_2$, CuAlO$_2$, and a mixture thereof.

4. The organic-inorganic perovskite based solar cell of claim 1, wherein the mesoporous insulating layer is made of semiconductor particles selected from the group consisting of ZrO$_2$, Al$_2$O$_3$, SiO$_2$, SiC, Si$_3$N$_4$, Ca$_3$(PO$_4$)$_2$, and a mixture thereof.

5. The organic-inorganic perovskite based solar cell of claim 1, wherein the conductive substrate is indium tin oxide (ITO) film substrate, fluorine-doped tin oxide (FTO), film substrate, ZnO—Ga$_2$O$_3$ film substrate, ZnO-Al$_2$O$_3$ film substrate, or tin-based oxides film substrate.

6. The organic-inorganic perovskite based solar cell of claim 1, wherein one additional blocking layer is deposited onto the conductive substrate to form an intervening layer between the conductive substrate and the mesoporous P-I-N framework.

7. The organic-inorganic perovskite based solar cell of claim 1, wherein the negative electrode is gold (Au), silver (Ag), aluminum (Al), copper (Cu), platinum (Pt), nickel (Ni), or carbon (C).

8. The organic-inorganic perovskite based solar cell of claim 1, wherein the organic-inorganic perovskite material has a formula of $CH_3NH_3PbX_mY_{3-m}$, wherein m is an integer from 1 to 3; and X and Y are independently selected from the group consisting of iodine (I), bromine (Br), and chlorine (CI).

9. An organic-inorganic perovskite based solar cell comprising a conductive substrate, a mesoporous P-I-N framework, and a negative electrode, wherein the mesoporous P-I-N framework is disposed between the conductive substrate and the negative electrode, and the mesoporous P-I-N framework comprises a mesoporous n-type semiconductor layer, a mesoporous insulating layer, and a mesoporous p-type semiconductor layer and further comprises an organic-inorganic perovskite light absorbing material; wherein:

the organic-inorganic perovskite light absorbing material is present in mesopores of the mesoporous n-type semiconductor layer;

the organic-inorganic perovskite light absorbing material is present in mesopores of the mesoporous insulating layer;

the organic-inorganic perovskite light absorbing material is present in mesopores of the mesoporous p-type semiconductor layer;

the mesoporous n-type semiconductor layer is disposed on the conductive substrate;

the mesoporous insulating layer is disposed between the mesoporous n-type semiconductor layer and the mesoporous p-type semiconductor layer;

the mesoporous p-type semiconductor layer is in contact with the negative electrode;

the mesoporous n-type semiconductor is made of semiconductor particles selected from the group consisting of Si, $TiO_2$, $SnO_2$, ZnO, $Zn_2SnO_4$, $Nb_2O_5$, $WO_3$, $BaTiO_3$, $SrTiO_3$, and a mixture thereof;

the mesoporous insulating layer is made of semiconductor particles selected from the group consisting of $ZrO_2$, $Al_2O_3$, $SiO_2$, SiC, $Si_3N_4$, $Ca_3(PO_4)_2$, and a mixture thereof; and the mesoporous p-type semiconductor is made of semiconductor particles selected from the group consisting of NiO, CuO, CuSCN, Cut $CuGaO_2$, $CuCrO_2$, $CuAlO_2$, and a mixture thereof.

10. The solar cell of claim 9, wherein the conductive substrate is indium tin oxide (ITO) film substrate, fluorine-doped tin oxide (FTO) film substrate, ZnO—$Ga_2O_3$ film substrate, ZnO-$Al_2O_3$ film substrate, or tin-based oxides film substrate.

11. The solar cell of claim 9, wherein one additional blocking layer is deposited onto the conductive substrate to form an intervening layer between the conductive substrate and the mesoporous P-I-N framework.

12. The solar cell of claim 9, wherein the negative electrode is gold (Au), silver (Ag), aluminum (Al), copper (Cu), platinum (Pt), nickel (Ni), or carbon (C).

13. The solar cell of claim 9, wherein the organic-inorganic perovskite material has a formula of $CH_3NH_3PbX_mY_{3-m}$, wherein:

m is an integer from 1 to 3; and

X and Y are independently selected from the group consisting of iodine (I), bromine (Br), and chlorine (CI).

* * * * *